United States Patent
Heo et al.

(10) Patent No.: US 7,558,127 B2
(45) Date of Patent: *Jul. 7, 2009

(54) DATA OUTPUT CIRCUIT AND METHOD IN DDR SYNCHRONOUS SEMICONDUCTOR DEVICE

(75) Inventors: Nak-Won Heo, Gyeonggi-do (KR); Chang-Sik Yoo, Seoul-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/105,209

(22) Filed: Apr. 17, 2008

(65) Prior Publication Data

US 2008/0225606 A1    Sep. 18, 2008

Related U.S. Application Data

(62) Division of application No. 10/411,724, filed on Apr. 11, 2003, now Pat. No. 7,376,021.

(30) Foreign Application Priority Data

Nov. 18, 2002  (KR) ............................... 2002-71747
Jan. 3, 2003    (KR) ............................... 2003-00338

(51) Int. Cl.
  *G11C 7/00*   (2006.01)
  *G11C 11/34*  (2006.01)
  *G06F 12/00*  (2006.01)
  *G06F 13/00*  (2006.01)

(52) U.S. Cl. .................. 365/189.05; 365/189.011; 365/189.02; 365/189.04; 365/189.08; 365/220; 365/221; 365/230.02; 365/230.04; 365/230.08; 710/65; 710/71; 711/104; 711/105; 711/168

(58) Field of Classification Search ............ 710/65, 710/71; 711/104, 105, 167–169; 365/189.01, 365/189.02, 189.04, 189.05, 189.08, 189.12, 365/220, 221, 230.02, 230.04, 230.06, 230.08, 365/233

See application file for complete search history.

(56) References Cited

U.S. PATENT DOCUMENTS 6,163,491 A    12/2000    Iwamoto et al.

(Continued)

FOREIGN PATENT DOCUMENTS

EP    1 028 427 A1    8/2000

(Continued)

OTHER PUBLICATIONS

English language abstract of Korean Publication No. 2000-0044572.

(Continued)

*Primary Examiner*—Tanh Q Nguyen
(74) *Attorney, Agent, or Firm*—Marger Johnson & McCollom, P.C.

(57) ABSTRACT

Embodiments of the present invention include a data output circuit that can read data in parallel from a plurality of latches in a pipeline circuit. Even-numbered data and odd-numbered data are simultaneously output over a single clock cycle, and are then converted into DDR data and are then serially output. By moving data in this manner, embodiments of the invention can reduce the number of necessary control signals by as much as 50% over conventional data output circuits.

7 Claims, 7 Drawing Sheets

U.S. PATENT DOCUMENTS

| | | | |
|---|---|---|---|
| 6,201,760 B1 | 3/2001 | Yun et al. |
| 6,275,423 B1 | 8/2001 | Edo |
| 6,282,150 B1 | 8/2001 | Edo |
| 6,335,889 B1 | 1/2002 | Onodera |
| 6,347,064 B1 | 2/2002 | Seo |
| 6,404,697 B1 | 6/2002 | Ryu et al. |
| 6,631,090 B1 | 10/2003 | Kwak et al. |
| 6,724,686 B2 | 4/2004 | Ooishi et al. |
| 6,834,015 B2 | 12/2004 | Yoon |

FOREIGN PATENT DOCUMENTS

| | | |
|---|---|---|
| EP | 1 028 429 A2 | 8/2000 |
| JP | 2001-189076 | 7/2001 |
| JP | 2001-023371 | 1/2006 |
| KR | 2000-0044572 | 7/2000 |
| KR | 2001-0048248 | 6/2001 |

OTHER PUBLICATIONS

English language abstract of Korean Publication No. 2001-0048248.

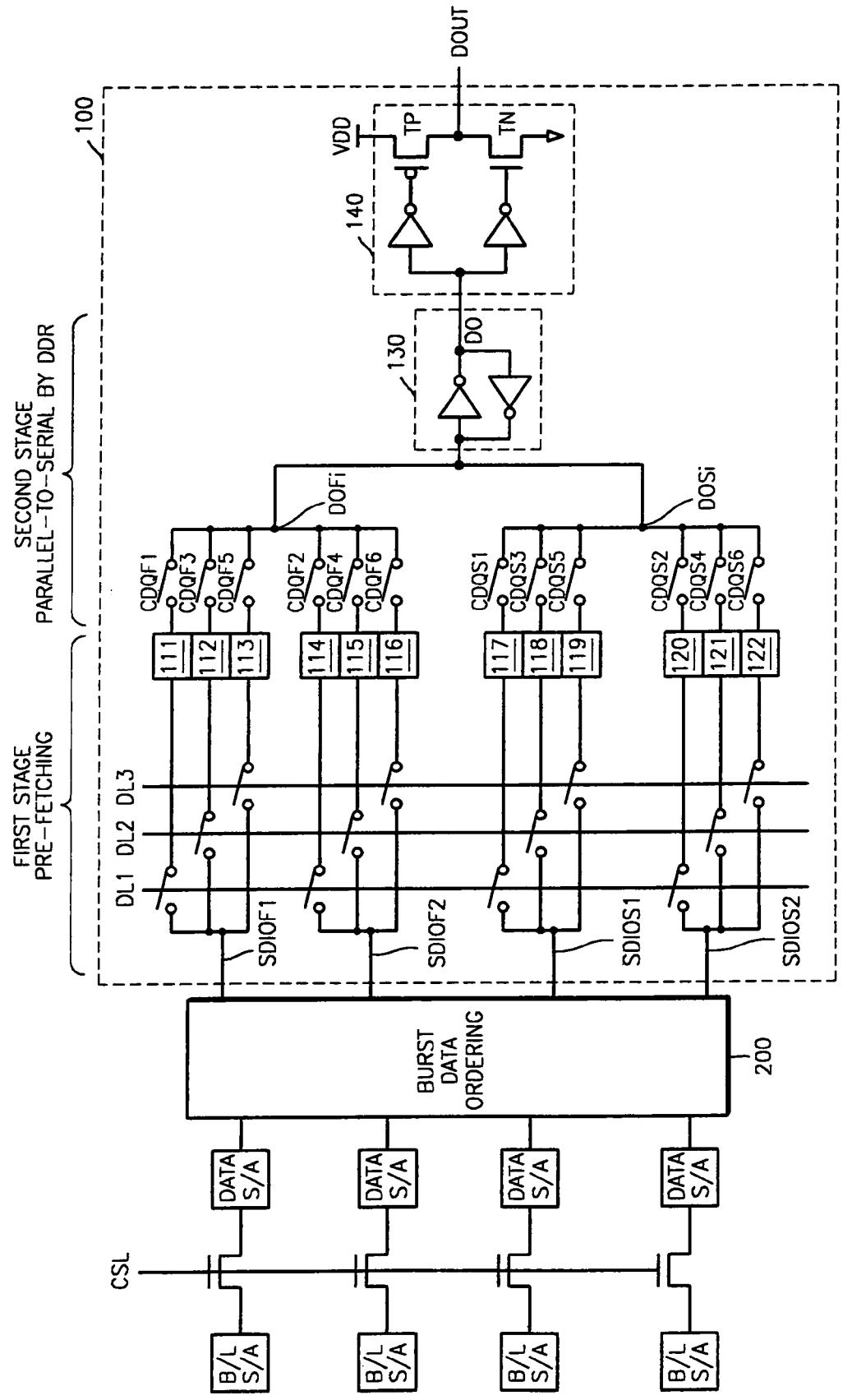
FIG. 1 (CONVENTIONAL)

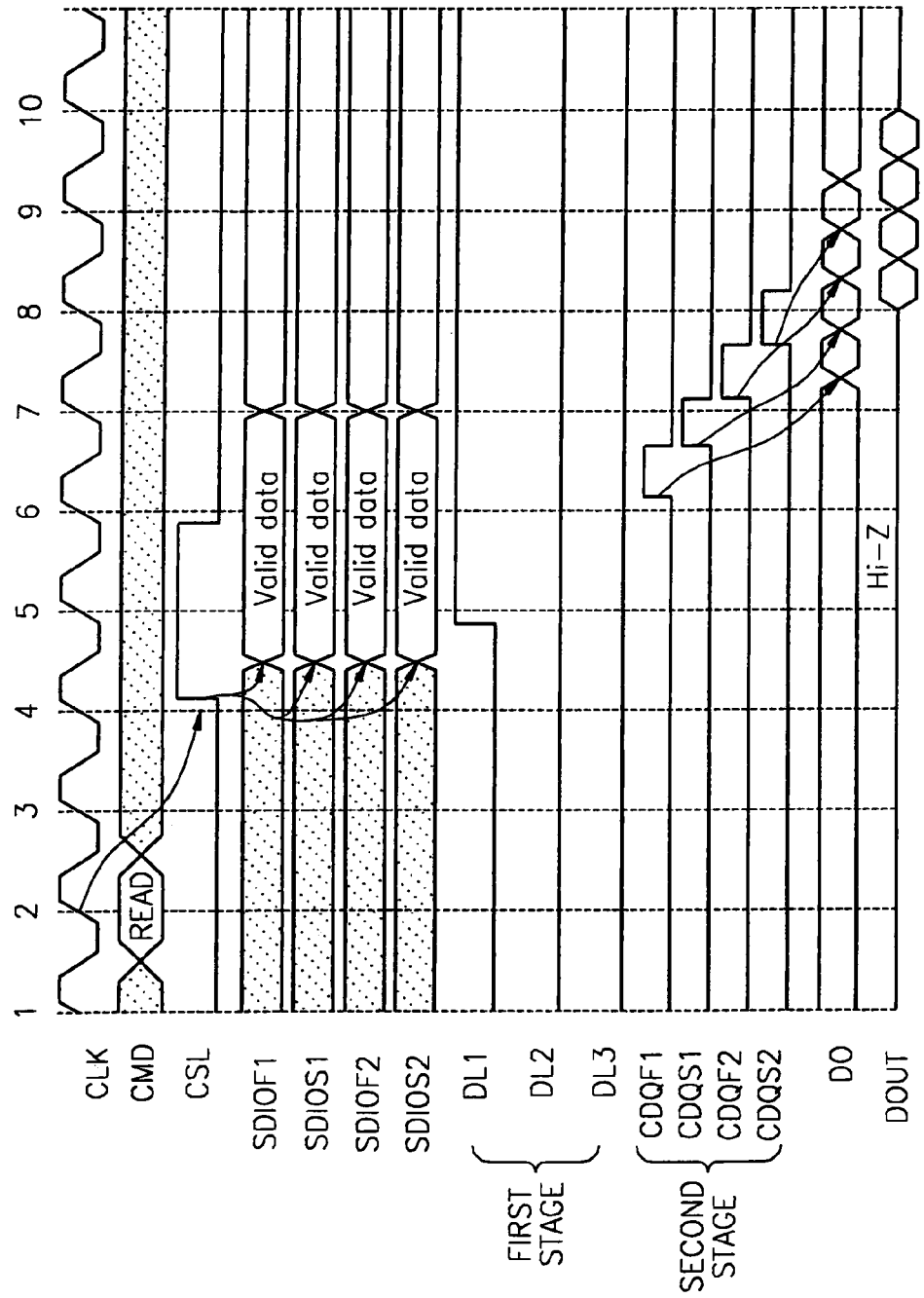
FIG. 2 (CONVENTIONAL)

DATA OUTPUT CIRCUIT AND METHOD IN DDR SYNCHRONOUS SEMICONDUCTOR DEVICE

CROSS-REFERENCE TO RELATED APPLICATIONS

This application is a Divisional of U.S. patent application Ser. No. 10/411,724, filed Apr. 11, 2003, now pending, which claims priority from Korean Patent Application Nos. 2002-71747, filed Nov. 18, 2002, and 2003-00338, filed Jan. 3, 2003, all of which are incorporated herein for all purposes.

TECHNICAL FIELD

This disclosure relates to a data output circuit and a related method for double data rate synchronous semiconductor memory devices.

BACKGROUND

DDR (double data rate) semiconductor devices are widely used as main memory for computer systems and other data devices. DDR memory devices are so named because they are capable of outputting two-bits of data in a single clock period, using a single data input/output pin. With the spread of DDR semiconductor devices, the operating frequency of devices has been increased.

Since present high-speed graphic memories require a minimal operational speed of about 500 MHz, a four-bit pre-fetch method has been widely adopted over the conventional two-bit pre-fetch method. Correspondingly, the number of CAS (Column Access Strobe) latencies in memories has increased. For the convenience of explanation, when the number of CAS latencies is n (where n is a positive integer number), it will be expressed as 'CL=n.' tCK is a unit used to measure clock cycles. In general, in a four-bit pre-fetch type memory, four bits of data are input or output through one data input/output pin in two tCKs. In addition, since a column selection line (CSL) is activated over a period of two clock cycles in the four-bit pre-fetch type memory, it is possible to issue a read command every two clock cycles. Accordingly, a minimum time gap (referred to as tCCD) between two read commands is two tCKs.

As described above, since the number of CSLs and a period of time during which a CSL is activated have increased, core timing, i.e., the time between when a CSL is activated and when data are developed by a data sense amplifier, does not lead to a serious problem in a high-speed device having a speed of 500 MHz or greater. More important than core timing, in forming a high-frequency device, is a data input/output element in a semiconductor device.

A "wave-pipeline" type data output circuit has been widely used to make high-speed memories with long latency. The number of latches per bit of data that is necessary to constitute a pipeline in such a wave-pipeline type data output circuit is represented by an integer value that is equal to, or the next integer larger than 'a maximum number of latencies/tCCD.' Accordingly, when a maximum number of latencies is 6, three latches are required for each bit. When a maximum number of latencies is 7, four latches are required for each bit. Since four data elements are output through a data input/output pin in response to one read command in a four-bit pre-fetch type memory, 12 latches are required for each data input/output pin when the maximum number of latencies is 6. Similarly, when a maximum number of latencies is 7, the number of latches required for each data input/output pin is 16.

FIG. 1 is a diagram illustrating a conventional data output circuit of a DDR semiconductor device. A data output circuit 100 is a wave-pipeline type data output circuit that adopts a four-bit pre-fetch method and satisfies the following conditions: CL=6 and tCCD=2 tCKs.

The data output circuit 100 includes twelve latches 111~122 and an output data buffer 140. For the convenience of explanation, a bitline sense amplifier B/L S/A, a data sense amplifier DATA S/A, and a burst data ordering unit 200 are shown in FIG. 1 together with the data output circuit 100.

When a wordline is activated, data stored in a memory cell are conveyed by a bitline (not shown) and are sensed and amplified by the bitline sense amplifier B/L S/A.

Data corresponding to an activated CSL among the data sensed by the bitline sense amplifier B/L S/A are transmitted to the data sense amplifier DATA S/A and amplified. Here, since the data output circuit 100 adopts a four-bit pre-fetch method, four column selection lines (CSL1-CSL4) are activated at the same time in response to one read command.

The data of the bitline sense amplifier B/L S/A corresponding to the activated CSL are developed by the data sense amplifier DATA S/A, are arranged in an appropriate order by the burst data ordering unit 200, and are simultaneously input into four of the twelve latches 111~122 by operation of one of the three switches DL1, DL2, or DL3.

The data output circuit 100 shown in FIG. 1 multiplexes data output from the latches 111~122 so that even-numbered data are multiplexed separately from odd-numbered data and then outputs the results of the multiplexing. The even-numbered data are output in response to rising edges of a clock, and the odd-numbered data are output in response to falling edges of the clock.

FIG. 2 is a diagram illustrating the output timing of the conventional data output circuit 100 shown in FIG. 1. The operation of the conventional data output circuit 100 will be described in the following with reference to FIGS. 1 and 2.

Four data SDIOF1, SDIOF2, SDIOS1, and SDIOS2 simultaneously output from the burst data ordering unit 200 are sequentially input into latches of their corresponding bits. The first datum SDIOF1 is input into a single latch among the first through third latches 111~113, the second datum SDIOF2 is input into a single latch among the fourth through sixth latches 114~116, the third datum SDIOS1 is input into a single latch among the seventh through ninth latches 117~119, and the fourth datum SDIOS2 is input into a single latch among the tenth through twelfth latches 120~122. Which latches the first through fourth data SDIOF1, SDIOF2, SDIOS1, and SDIOS2 are respectively input into is controlled by input control signals DLj (j is between 1 and 3).

Even-numbered output control signals CDQFj (j is between 1 and 6) and odd-numbered output control signals CDQSj (j is between 1 and 6) determine a latch the data of which will be output to an even-numbered node DOFi and an odd-numbered node DOSi.

The data output from the first through sixth latches 111~116 are output to the even-numbered node DOFi when their corresponding even-numbered output control signal CDQFj (j between 1 and 6) is activated. The data output from the seventh through twelfth latches 117~122 are output to the odd-numbered node DOSi when their corresponding odd-numbered output control signal CDQSj (between 1 and 6) is activated. The data output to the even-numbered node DOFi and the odd-numbered node DOSi are sequentially latched by a latch 130, and are output to the outside of the DDR semiconductor device via the output data buffer 140.

The output data buffer 140 generally includes a pull-up transistor TP and a pull-down transistor TN. The pull-up transistor TP and the pull-down transistor TN each drive an output signal DOUT at either a power supply voltage or a ground voltage in response to output data DO of the latch 130.

Referring to FIG. 2, four output control signals CDQF1, CDQS1, CDQF2, and CDQS2 are sequentially activated at intervals of half a clock cycle, i.e., at intervals of tCK/2. Then, and in sequence controlled by CDQF1, CDQS1, CDQF2, and CDQS2, respectively, the datum contained in the first latch 111 is output to the even-numbered node DOFi, the datum contained in the seventh latch 117 is output to the odd-numbered node DOSi, the datum contained in the fourth latch 114 is output to the even-numbered node DOFi, and the datum contained in the tenth latch 120 is output to the odd-numbered node DOSi. The data output circuit 100 shown in FIG. 1 needs 12 output control signals (CDQF1, CDQS1, CDQF2, and CDQS2 for each of the timing signals DL1, DL2, and DL3) generated at intervals of tCK/2, so as to correctly output the data of each of the latches 111~122 as DDR data.

If a maximum number of latencies in a semiconductor memory device is 7, the number of latches is increased to 16, and the semiconductor memory device needs 16 different output control signals. Because of the high operational frequencies involved, controlling so many output control signals in a short time becomes problematic.

Thus, in conventional circuits, as the operational frequency of a semiconductor device increases, in other words, as tCK decreases, it becomes more difficult to control skews among the output control signals. In addition, conventional data output circuits tend to generate a considerable number of output control signals. Moreover, since it is very complex to transmit such output control signals to a pipeline circuit of the data output circuit, it is difficult to control data output.

Embodiments of the invention address this and other limitations in the prior art.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are to facilitate explanation and understanding.

FIG. 1 is a diagram illustrating a conventional data output circuit of a DDR semiconductor device.

FIG. 2 is a diagram illustrating the output timing of a conventional data output circuit shown in FIG. 1.

DETAILED DESCRIPTION OF THE INVENTION

In the following detailed descriptions, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the invention are directed toward an output circuit in a DDR device that simultaneously outputs both odd and even data from a plurality of latches in a pipeline circuit over a first clock cycle. The odd and even data are then transferred into two bits of serial DDR data. The process repeats for the second and subsequent clock cycles.

Figure 3:
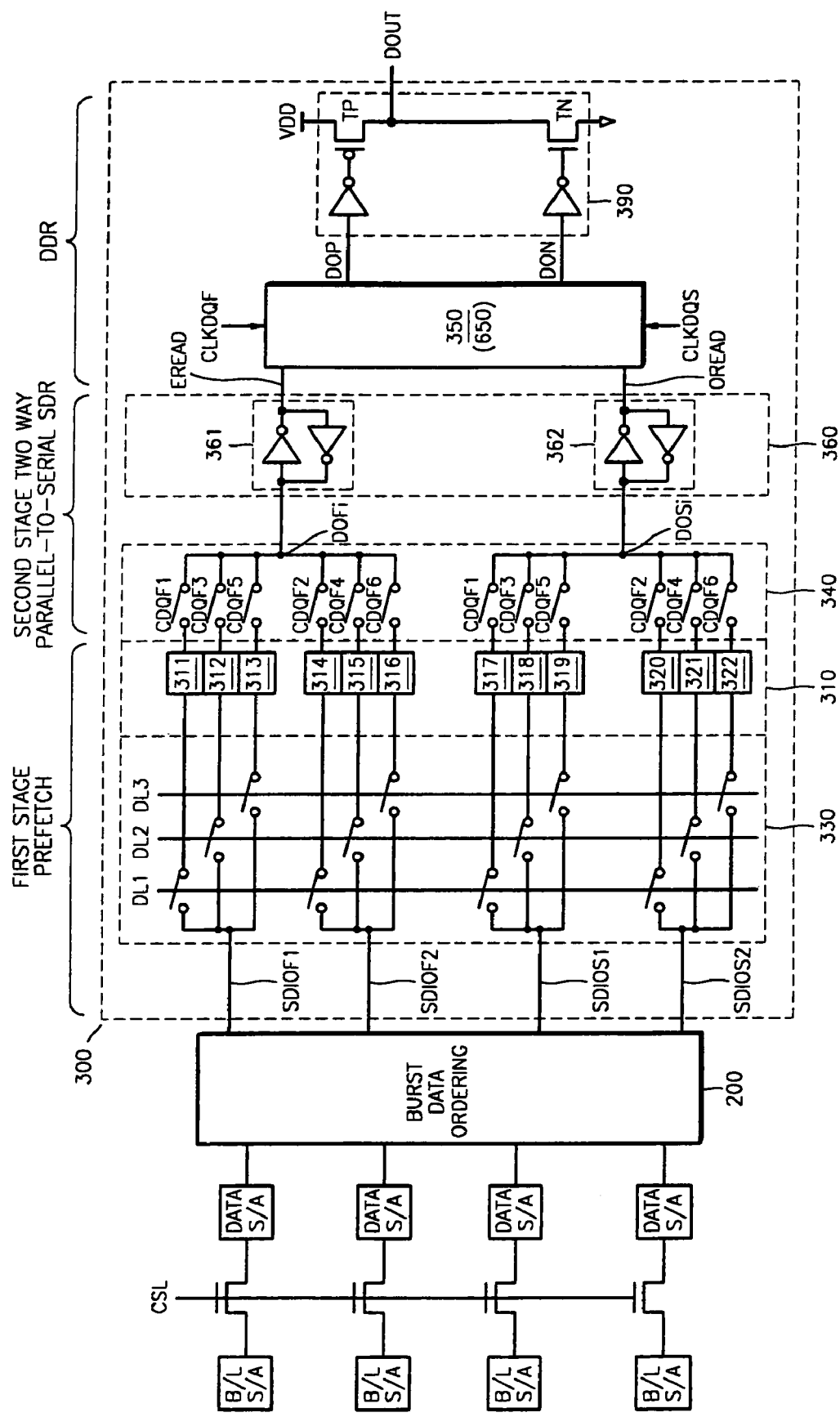
FIG. 3 is a schematic diagram illustrating a data output circuit of a DDR semiconductor device according to embodiments of the invention.

FIG. 3 is a diagram illustrating a data output circuit of a DDR synchronous semiconductor device according to embodiments of the present invention. A data output circuit 300 is a wave-pipeline type data output circuit which supports a four-bit pre-fetch method and meets the following conditions: CL=6, tCCD=2, and burst length (BL)=4.

Referring to FIG. 3, the data output circuit 300 includes a pipeline circuit unit, a multiplexer 350, and an output data buffer 390. The pipeline circuit unit includes a latch unit 310, an input switching unit 330, and an output switching unit 340. Between the output switching unit 340 and the multiplexer 350 is an even/odd circuit 360.

The pipeline circuit unit sequentially receives a plurality of data SDIOF1, SDIOF2, SDIOS1, and SDIOS2 read from memory cells in parallel in response to input control signals DLj (j is between 1 and 3) and sequentially outputs the input data SDIOF1 and SDIOS1 in parallel and the input data SDIOF2 and SDIOS2 in parallel in response to output control signals CDQFj (j is between 1 and 6).

The multiplexer 350 receives the two-bit parallel data simultaneously output from the pipeline circuit unit, converts the input data into two-bit serial data, i.e., DDR data for one clock cycle, and outputs the two-bit serial data.

Four bits of data that were read from memory cells are amplified by a bitline sense amplifier B/L S/A and a data sense amplifier DATA S/A. These four bits of data are arranged in an appropriate order by the burst data ordering unit 200, and are simultaneously input into the latch unit 310 of the data output circuit 300.

The latch unit 310 includes six even-numbered data latches 311~316 for storing the first even-numbered data SDIOF1 and the second even-numbered data SDIOF2 and six odd-numbered data latches 317~322 for storing the first odd-numbered data SDIOS1 and the second odd-numbered data SDIOS2. As described above, the number of latches included in the latch unit 310 may vary depending on the maximum number of latencies in the data output circuit 300.

Here, even-numbered data represent data output in response to even-numbered phases of a clock cycle, and odd-numbered data represent data output in response to odd-numbered phases of a clock cycle. In this disclosure, even-numbered phases represent rising edges of a clock cycle, and odd-numbered phases represent falling edges of a clock cycle, but those skilled in the art recognize that other conventions are possible.

Since the semiconductor device in the present embodiment adopts a four-bit pre-fetch method, data are output over a period of two clock cycles. For the convenience of explanation, data to be output in a first clock in a two-tCK output clock cycle are referred to as first data, and data to be output in a second clock are referred to as second data.

Accordingly, the first even-numbered datum SDIOF1 is output in response to the rising edge of the first clock, the first odd-numbered datum SDIOS1 is output in response to the falling edge of the first clock, the second even-numbered datum SDIOF2 is output in response to the rising edge of the second clock, and the second even-numbered datum SDIOS2 is output in response to the falling edge of the second clock.

The input switching unit 330 includes a plurality of switches which are turned on and turned off in response to the input control signals DLj. Specifically, as illustrated in FIG. 3, four switches in the input switching unit 330 are simultaneously turned on in response to the input control signals DLj (j=1 to 3) and transmit data from the burst ordering circuit 200 to corresponding latches.

The output switching unit 340 includes a number of switches that are turned on and off in response to the input control signals CDQFj (j=1 to 6). Specifically, the switches in the output switching unit 340 are turned on in response to the input control signals CDQFj and transmit data output from their corresponding latches to the multiplexer 350.

The operation of the pipeline circuit unit including the latch unit 310, the input switching unit 330, and the output switching unit 340 is described in greater detail below.

The first and second even-numbered data SDIOF1 and SDIOF2 and the first and second odd-numbered data SDIOS1 and SDIOS2 that are simultaneously output from the burst data ordering unit 200 are input into their corresponding latches in response to the first, second, and third input control signals DL1, DL2, and DL3. In other words, the first and second even-numbered data and the first and second odd-numbered data are input into the first, fourth, seventh, and tenth latches 311, 314, 317, and 320 in response to the first input control signal DL1, are input into the second, fifth, eighth, and eleventh latches 312, 315, 318, and 321 in response to the second input control signal DL2, and are input into the third, sixth, ninth, and twelfth latches 313, 316, 319, and 322 in response to the third input control signal DL3. The first, second and third input control signals DL1, DL2, and DL3 are sequentially activated.

Thus, three bits of data passed through each of the SDIOF1, SDIOF2, SDIOS1, and SDIOS2 during the time the first, second, and third input control signals DL1, DL2, and DL3 are activated. Appropriately, the twelve latches 311~322 store those twelve bits of data each in a separate latch.

The data input into the first through twelfth latches 311~322 are output to an even-numbered node DOFi and an odd-numbered node DOSi when the first through sixth output control signals CDQF1 through CDQF6 are activated. Specifically, the data input into the first and seventh latches 311 and 317 are output to the even-numbered node DOFi and the odd-numbered node DOSi, respectively, in response to the first output control signal CDQF1. The data input into the second and eighth latches 312 and 318 are output to the even-numbered node DOFi and the odd-numbered node DOSi, respectively, in response to the third output control signal CDQF3. The data input into the third and ninth latches 313 and 319 are output to the even-numbered node DOFi and the odd-numbered node DOSi, respectively, in response to the fifth output control signal CDQF5. The data input into the fourth and tenth latches 314 and 320 are output to the even-numbered node DOFi and the odd-numbered node DOSi, respectively, in response to the second output control signal CDQF2. The data input into the fifth and eleventh latches 315 and 321 are output to the even-numbered node DOFi and the odd-numbered node DOSi, respectively, in response to the fourth output control signal CDQF4. The data input into the sixth and twelfth latches 316 and 322 are output to the even-numbered node DOFi and the odd-numbered node DOSi, respectively, in response to the sixth output control signal CDQF6.

As described above, one-bit even-numbered data and one-bit odd-numbered data are simultaneously output from the output switching unit 340 in response to the same output control signal. In other words, the first even-numbered data SDIOF1 and the first odd-numbered data SDIOS1 are simultaneously output in response to the first, third, or fifth output control signal CDQF1, CDQF3, or CDQF5, and the second even-numbered data SDIOF2 and the second odd-numbered data SDIOS2 are output in response to the second, fourth, or sixth output control signal CDQF2, CDQF4, or CDQF6. Accordingly, while twelve different output control signals CDQF1 through CDQF6 and CDQS1 through CDQS6 are required in the prior art, as shown in FIG. 1, only the six output control signals CDQF1 through CDQF6 are required in embodiments of the present invention. The first through sixth output control signals CDQF1 through CDQF6 are sequentially activated at intervals of 1 tCK.

The data output to the even-numbered node DOFi and the odd-numbered node DOSi are latched in the even/odd circuit 360 by latches 361 and 362, respectively, and then are input into the multiplexer 350.

The multiplexer 350 receives even-numbered data EREAD from the even-numbered node DOFi and receives odd-numbered data OREAD from the odd-numbered node DOSi. Then, the multiplexer 350 sequentially outputs the even-numbered data EREAD in response to an even-numbered output clock CLKDQF and outputs the odd-numbered data OREAD in response to an odd-numbered output clock CLKDQS.

The even-numbered output clock CLKDQS and the odd-numbered output clock CLKDQS have a phase difference of one-half of a clock cycle (tCK/2). Accordingly, the multiplexer 350 receives two-bits of parallel data (even-numbered data and odd-numbered data) that are output from the pipeline circuit, converts the two-bits of parallel data into two-bits of serial data, i.e., DDR data, over a period of one clock cycle, and then outputs the two-bits of serial data.

Figure 4:
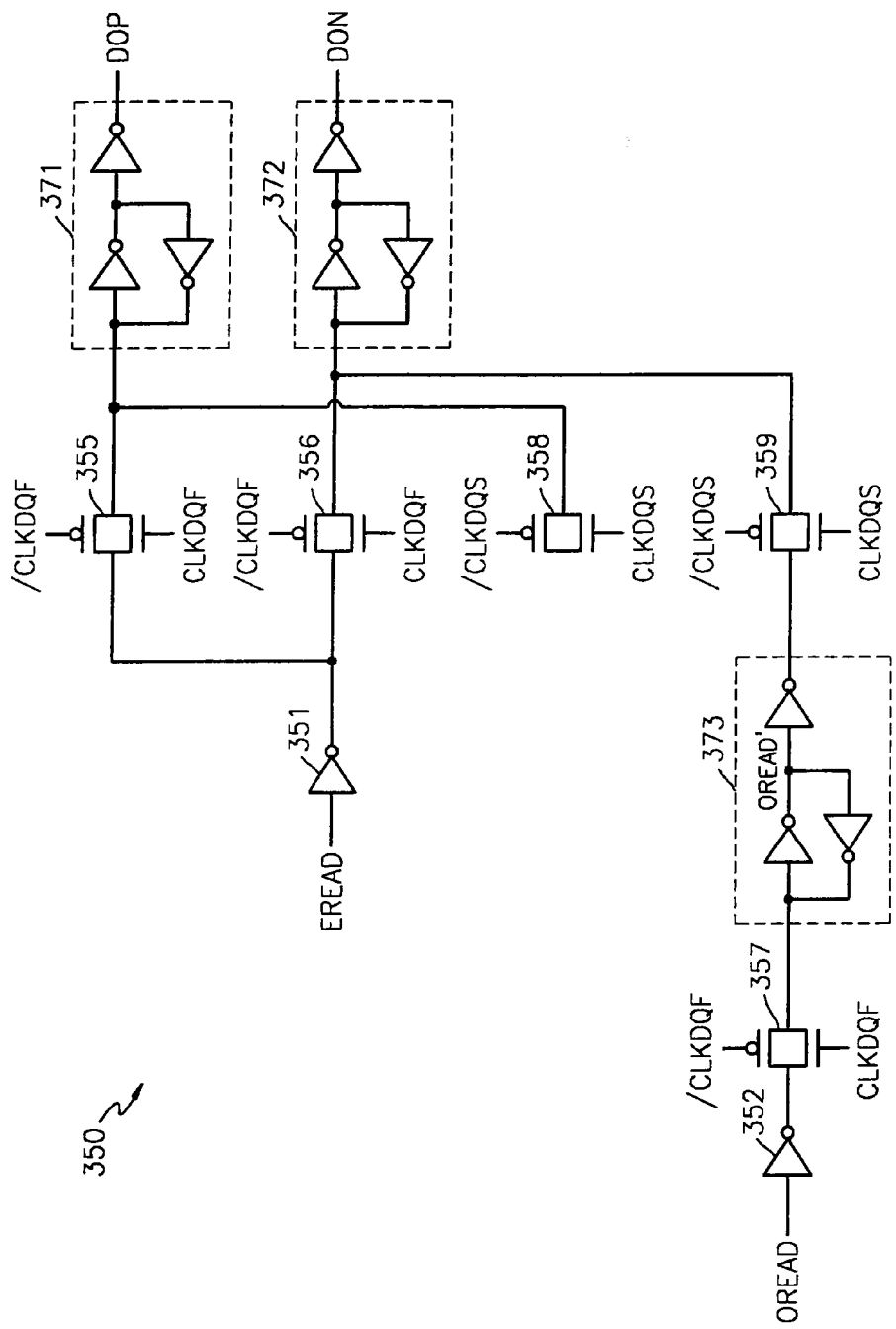
FIG. 4 is a detailed circuit diagram of a multiplexer for use with the semiconductor device shown in FIG. 3.

An example of the multiplexer 350 that operates according to embodiments of the invention is shown in FIG. 4. Referring to FIG. 4, the multiplexer 350 includes inverters 351 and 352, transmission gates, also called switches 355, 356, 357, 358, and 359, and latches 371, 373, and 373.

The inverters 351 and 352 invert the even-numbered data EREAD and the odd-numbered data OREAD that are respectively input to the inverters 351, 352. The switches 355, 356, and 357 are turned ON or OFF in response to the even-numbered output clock CLKDQF, and the switches 358 and 359 are turned ON or OFF in response to the odd-numbered output clock CLKDQS.

The even-numbered data EREAD that are input through the even-numbered node DOFi (FIG. 3) are latched by the latches 371 and 372 in response to the even-numbered output clock CLKDQF turning on the switches 355 and 356, and then the results of the latching are output as pull-up data DOP and pull-down data DON. The odd-numbered data OREAD that are input through the odd-numbered node DOSi (FIG. 3) are input into the temporary latch 373 in response to the even-numbered output clock CLKDQF. Data OREAD' of the temporary latch 373 are latched by the latches 371 and 372 in response to the odd-numbered output clock CLKDQS turning on the switches 358 and 359, and then the results of the latching are output as the pull-up data DOP and the pull-down data DON. Since the odd-numbered output clock CLKDQS and the even-numbered output clock CLKDQF have a phase difference of half a clock cycle (tCK/2), it is possible to say that the pull-up data DOP and the pull-down data DON are DDR data.

Referring to FIG. 3 again, the pull-up data DOP and the pull-down data DON are transferred into the output data buffer 390. The output data buffer 390 generates an output signal DOUT to be output to the outside of the semiconductor device, in response to the pull-up data DOP and the pull-down data DON. Specifically, the output data buffer 390 includes a pull-up transistor TP, which pulls the output signal DOUT up to a power supply voltage in response to the pull-up data DOP, and a pull-down transistor TN, which pulls the output signal DOUT down to a ground voltage in response to the pull-down data DON. When the pull-up data DOP and the pull-down data DON are at a high level, the pull-up transistor TP is turned on and the pull-down transistor TN is turned off so that an output signal DOUT having almost the same level as a power supply voltage is output. On the other hand, when the pull-up data DOP and the pull-down data DON are at a low level, the pull-up transistor TP is turned off and the pull-down transistor TN is turned on so that an output signal DOUT having almost the same level as a ground voltage is output.

In the above-described embodiment, an output data buffer 390 including a pull-up transistor and a pull-down transistor and operating in a pull-up/pull-down manner is used. Accordingly, two different kinds of data, i.e., the pull-up data DOP and the pull-down data DON, are output from the multiplexer 350 so as to control the pull-up transistor and the pull-down transistor, respectively. Different types of output buffers could be used, however, such as one that operates in an open-drain operating manner. In such a case, data output from a multiplexer 350 may vary depending on the operating manner of the particular output data buffer used.

Figure 5:
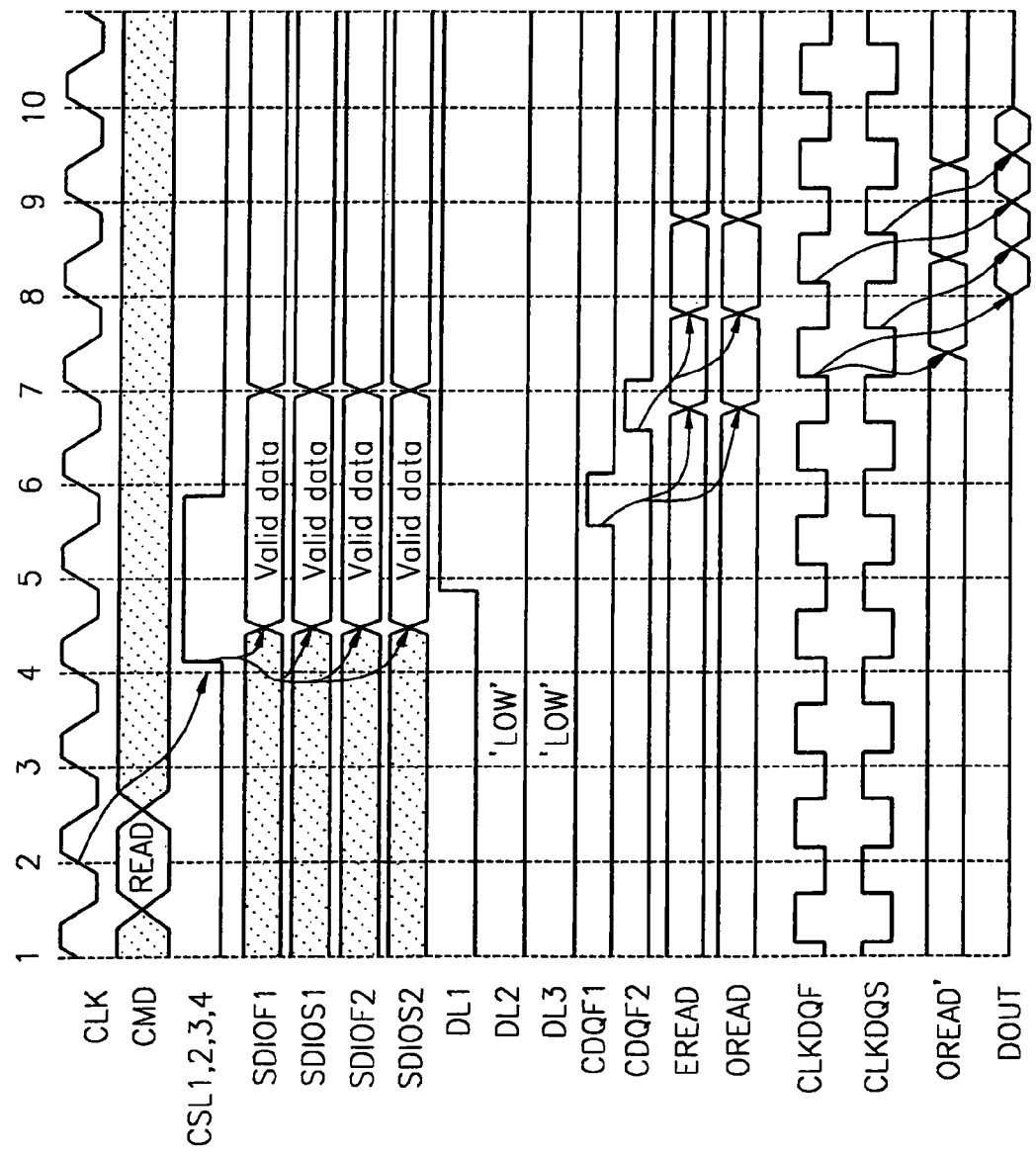
FIG. 5 is a timing diagram illustrating the output timing of the data output circuit shown in FIG. 3.

FIG. 5 is a timing diagram illustrating the output timing of the data output circuit 300 shown in FIG. 3. The operation of the data output circuit 300 will be described more fully with reference to FIGS. 3 and 5.

A column selection line CSL is activated in response to a read command READ, and data corresponding to the column selection line CSL are sensed and amplified by the data sense amplifier DATA S/A. Then, the burst data ordering unit 200 determines when the sensed and amplified data will be output.

The first and second even-numbered data SDIOF1 and SDIOF2 and the first and second odd-numbered data SDIOS1 and SDIOS2, which are simultaneously output from the burst data ordering unit 200, are input in parallel into their corresponding latches in response to the first, second and third input control signals DL1, DL2, and DL3. The four data SDIOF1, SDIOF2, SDIOS1, and SDIOS2 are simultaneously input into the first, fourth, seventh, and tenth latches 311, 314, 317, and 320, respectively, in response to the first input control signal DL1. In FIG. 5, only the first four pieces of data, stored into the first set of latches 311, 314, 317, and 320 is analyzed. The other eight pieces of data, stored in the other latches during times when the second and third control signals DL2 and DL3 operate in a similar manner.

Referring to FIG. 5, after the data is stored in the latches 311, 314, 317, and 320, the first and second output control signals CDQF1 and CDQF2 are sequentially activated. The datum from the first latch 311 and the datum from the seventh latch 317 are simultaneously latched by the latches 361 and 362, respectively, in response to the first output control signal CDQF1, and are input into the multiplexer 350 in parallel. The even-numbered datum EREAD input into the multiplexer 350 from the first latch 311 is output as the pull-up data DOP and the pull-down data DON in response to the even-numbered output clock CLKDQF. The odd-numbered datum OREAD input into the multiplexer 350 from the seventh latch 317 is temporarily stored in the temporary latch 373 in response to the even-numbered output clock CLKDQF and then is output as the pull-up data DOP and the pull-down data DON in response to the odd-numbered output clock CLKDQS.

In response to the second output control signal CDQF2, which is activated one clock cycle after the first output control signal CDQF1 has been activated, the datum from the fourth latch 314 and the datum from the tenth latch 320 are simultaneously latched by the latches 361 and 362, respectively, and are input into the multiplexer 350 in parallel. The even-numbered datum EREAD input into the multiplexer 350 from the fourth latch 314 is output as the pull-up data DOP and the pull-down data DON in response to the even-numbered output clock CLKDQF. In response to the odd-numbered output clock CLKDQS, the odd-numbered datum OREAD input into the multiplexer 350 from the tenth latch 320 is temporarily stored in the temporary latch 373 as the temporary odd-numbered data OREAD' in response to the even-numbered output clock CLKDQF. Then the temporary odd-numbered data OREAD' from the latch 373 is output as the pull-up data DOP and the pull-down data DON in response to the odd-numbered output clock CLKDQS.

The pull-up data DOP and the pull-down data DON output from the multiplexer 350 are data, every four bits of which are output in series over a period of two clock cycles.

The output data buffer 390 receives the pull-up data DOP and the pull-down data DON and generates the output signal DOUT in response to the pull-up data DOP and the pull-down data DON. The output signal DOUT is synchronized with the rising edge and falling edge of a predetermined clock CLK over a period of two clock cycles and is output to the outside of the semiconductor device.

Figure 6:
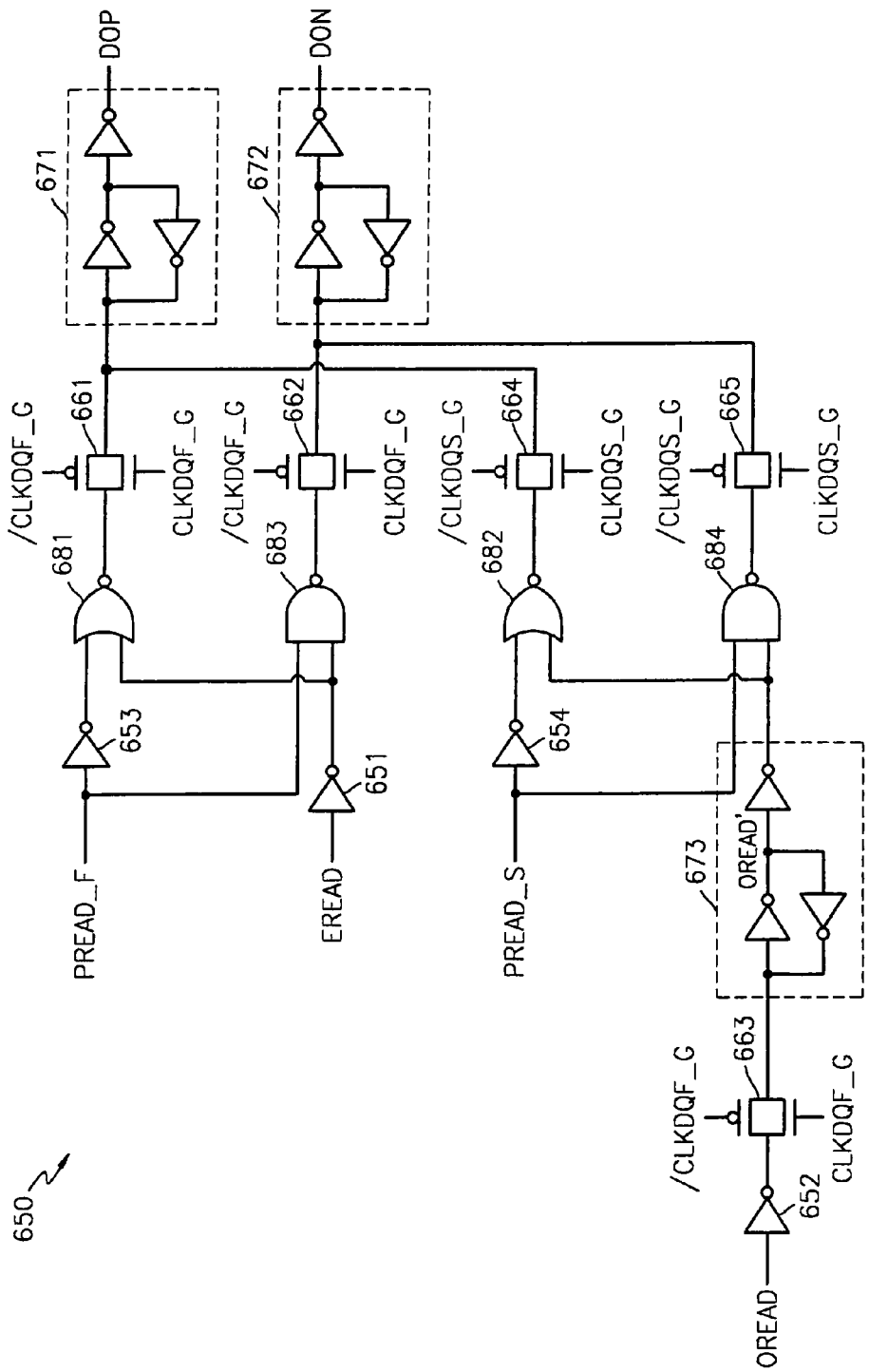
FIG. 6 is a detailed circuit diagram of another multiplexer for use with the semiconductor device of FIG. 3 according to other embodiments of the invention.

FIG. 6 is another example embodiment of a multiplexer 650 that can be used with the semiconductor device of FIG. 3. Compared to the embodiment 350 of FIG. 4, the multiplexer 650 of FIG. 6 includes two additional inputs, PREAD_F, and PREAD_S. The other inputs, EREAD and OREAD are the same as the multiplexer 350 of FIG. 4. The two additional inputs give the multiplexer 650 more timing precision when setting the output data line Dout in a high impedance (HI-Z) state, as described below.

In addition to the new inputs, two new clock signals, or, more specifically "gated" clock signals, CLKDQF_G and CLKDQS_G are present in the multiplexer 650 of FIG. 6. The clock signals CLKDQF_G and CLKDQS_G are termed "gated" because they have the same period and orientation as the data clocks CLKDQF and CLKDQS, respectively, but are only operative during portions of time that other signals, or "gates" are operative. Specifically, with reference to FIG. 7, the gated clock signal CLKDQF_G is generated by OR-functioning the signals CLKDQF and PREAD_F. The CLKDQFS_G signal is generated by OR-functioning the signals CLKDQF and PREAD_Z. The PREAD_Z signal is a delayed signal of PREAD_F.

The gated data clocks CLKDQF_G and CLKDQS_G are used to drive passgates or switches 661, 662, 663, 664, and 665. One benefit from such gated data clocks driving these switches serves to insulate the latches 671 and 672 from stray or spurious signals that could eventually cause noise or invalid data appear at the data output line Dout, thus interrupting the HI-Z state. In other words, by preventing the switches 661, 662, 663, and 664 from activating during times when no valid data can enter the latches 671 and 672, no stray signals can be entered into the latches 671 or 672 at those times.

The additional inputs PREAD_F and PREAD_S are used in conjunction with inverters 653, 654 and logic gates 681, 682, 683, and 684 to enable the multiplexer 650 to receive data from the EREAD and OREAD lines at appropriate times. In particular, when the input PREAD_F or PREAD_S is in a LOW state, the latch 671 stores a HIGH signal, while the latch 672 stores a LOW signal. Such signals, when later provided to the output data buffer 390 (FIG. 3) causes the output signal Dout to be in a HI-Z state; that is, neither pulled-up to VDD nor down to the ground reference. Conversely, when the inputs PREAD_F and PREAD_S are in a HIGH state, the multiplexer is enabled, and data inputs from the EREAD line or OREAD line cause the output data buffer 390 to be placed in either the pull-up or pull-down state, depending on the data content on the data input lines EREAD and OREAD. The inputs PREAD_F and PREAD_S are generated after the memory device receives a "read" command, and are asserted HIGH a certain time after the read command is received.

Figure 7:
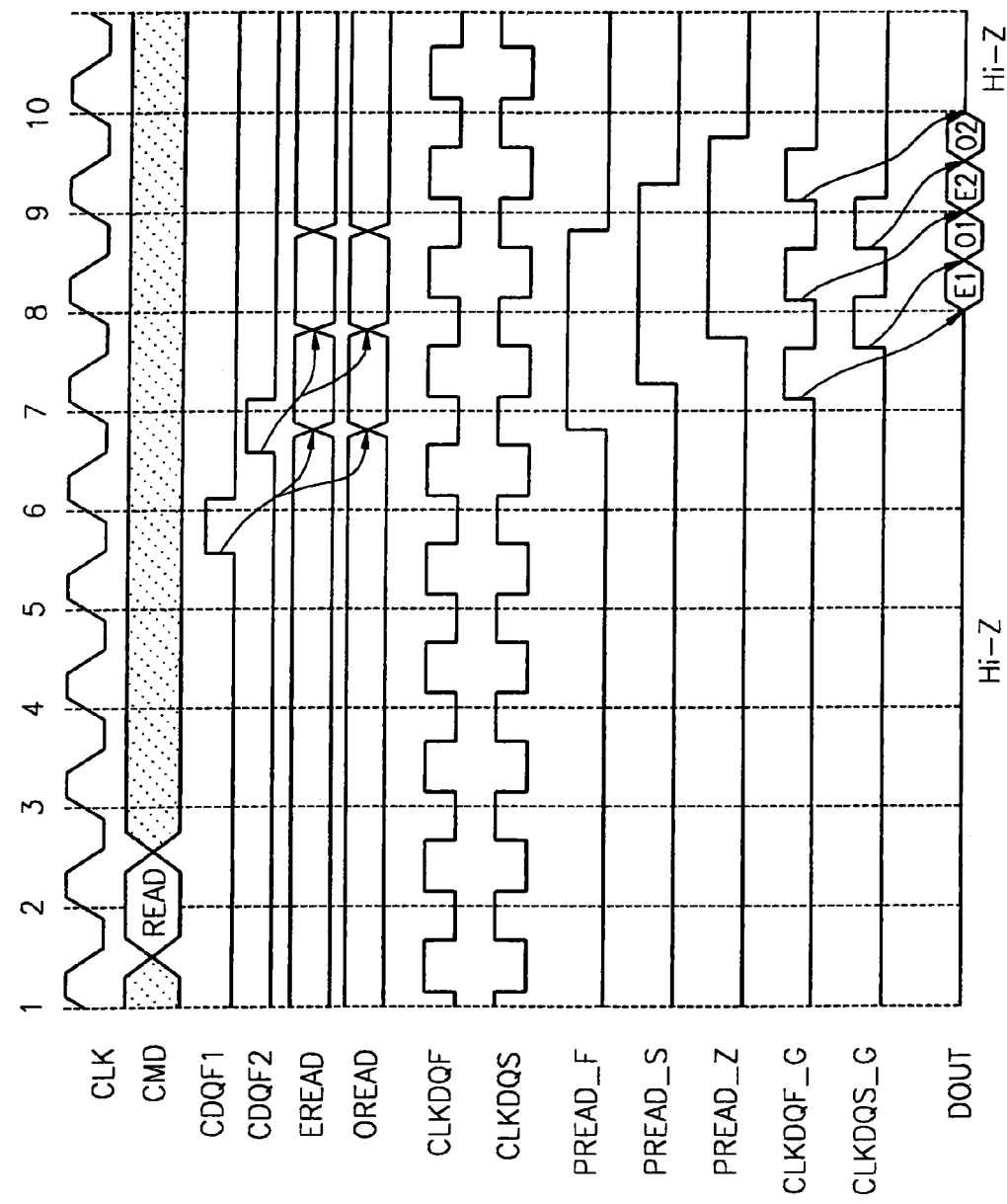
FIG. 7 is a timing diagram illustrating the output timing of the multiplexer shown in FIG. 6.

Thus, with reference to FIGS. 6 and 7, in operation, a memory device receives a read command. As discussed with reference to FIGS. 3 and 5, above, data is read from the memory cells and stored in the latches 311~322. Thereafter, the data clock signals CDQF1 and CDQF2 are generated, which transfers two bits of data from the latches 311~322 in parallel into the even/odd circuit 360, where the two bits are temporarily latched in the latches 361 and 362.

Next, the signals PREAD_F, PREAD_S, and PREAD_Z activate, thus enabling the multiplexer 650 of FIG. 6 to read the data from the EREAD and OREAD lines, and to output the ultimate data from the latches 671 and 672. Specifically, when the PREAD signals activate, the gated clocks CLKDQF_G and CLKDQS_G become active, driving the switches 661, 662, 663, 664, and 665, taking data at the DDR rate from the data lines EREAD and OREAD, and transferring the data into the latches 671 and 672. Output data from the MUX 650 then is sent to the output data buffer 390, which drives the data line Dout with the data that was ultimately read from the memory device.

As described above, in embodiments of the present invention, read data, which have been stored in a plurality of latches in a pipeline circuit, are not output as DDR data directly. Rather, even-numbered data and odd-numbered data are simultaneously output first over a period of one clock cycle. Then, the even-numbered data and the odd-numbered data are converted into DDR data and are output.

Accordingly, in embodiments of the present invention, it is possible to reduce the number of control signals necessary to output data stored in a plurality of latches of a pipeline circuit by as much as 50% and to extend a time gap among such control signals from tCK/2 to tCK over conventional circuits.

Additionally, although the examples given herein illustrate operation of a memory having a 4-bit pre-fetch operation, other pre-fetch depths are possible, such as 8 and 16, for instance. Implementations having differently sized pre-fetch buffers, burst lengths, latencies, and other common variables in memory circuits are well within the scope of one skilled in the art, after being taught the principles of the invention disclosed above.

Those skilled in the art recognize that the data output method described herein can be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention.

What is claimed is:

1. A semiconductor device including a data output circuit to output data read from memory cells, wherein the data output circuit comprises:
a first pipeline stage receiving, in parallel, a plurality of data from the memory cells and storing the received plurality of data, in response to a plurality of first control signals;
a second pipeline stage receiving, in parallel, at least two data among the plurality of data stored in the first pipeline stage and storing the received at least two data, in response to a plurality of second control signals; and
a multiplexer receiving the data stored in the second pipeline stage, and sequentially outputting the received data in response to a third control signal,
wherein the first pipeline stage comprises:
first through $m^{th}$ switch units receiving, in parallel, m-bit data provided from the memory cells, and
first through $m^{th}$ latch units disposed to correspond to the first through $m^{th}$ switch units and storing data transmitted through their corresponding switch units,
wherein the second pipeline stage comprises:
an $(m+1)^{th}$ switch unit coupled to some latch units among the first through $m^{th}$ latch units, and
an $(m+2)^{th}$ switch unit coupled to other latch units among the first through $m^{th}$ latch units,
wherein the plurality of second control signals are commonly provided to the $(m+1)^{th}$ switch unit and the $(m+2)^{th}$ switch unit such that the second pipeline stage stores simultaneously data through the $(m+1)^{th}$ switch unit and data through the $(m+2)^{th}$ switch unit, wherein m is an even integer greater than 2,
wherein the plurality of first control signals comprise n pipeline control signals. and each of the first through $m^{th}$ switch units comprises n switches respectively controlled by the n pipeline control signals. and each of the first through $m^{th}$ latch units comprises n latches respectively storing data transmitted by the n switches, where n is an integer greater than 1,
wherein the plurality of second control signals comprise n*m/2 distinct pipeline control signals that are sequentially activated,
wherein m*n/2 switches included in the $(m+1)^{th}$ switch unit sequentially output their corresponding data as even data in response to the sequential activation of the n*m/2 pipeline control signals, and m*n/2 switches included in the $(m+2)^{th}$ switch unit sequentially output their corresponding data as odd data in response to the sequential activation of the n*m/2 pipeline control signals.

2. The semiconductor device of claim 1, wherein the data output circuit further comprises an output buffer generating an output signal in response to data provided from the multiplexer.

3. The semiconductor device of claim 1, wherein the $(m+1)^{th}$ switch unit comprises switches corresponding in number to latches included in the some latch units; and
wherein the $(m+2)^{th}$ switch unit comprises switches corresponding in number to latches included in the other latch units.

4. The semiconductor device of claim 1, wherein:
the $(m+1)^{th}$ switch unit is coupled to m/2 latch units among the first through $m^{th}$ latch units, and comprises switches corresponding in number to latches included in the m/2 latch units;
the $(m+2)^{th}$ switch unit is coupled to the remaining m/2 latch units among the first through $m^{th}$ latch units, and comprises switches corresponding in number to latches included in the remaining m/2 latch units; and
the second pipeline stage further comprises $(m+1)^{th}$ latch unit receiving, in parallel, data transmitted through the $(m+1)^{th}$ switch unit and data transmitted through the $(m+2)^{th}$ switch unit.

5. The semiconductor device of claim 4, wherein the switches included in the $(m+1)^{th}$ switch unit have output terminals commonly coupled to a first common node, and the switches included in the $(m+2)^{th}$ switch unit have output terminals commonly coupled to a second common node.

6. The semiconductor device of claim 1, wherein a phase interval between the plurality of second control signals corresponds to one period of a reference clock of the semiconductor device.

7. The semiconductor device of claim 5, wherein the multiplexer receives, in parallel, the even data and the odd data through the first common node and the second common node, and alternately outputs the even data and the odd data.

* * * * *

UNITED STATES PATENT AND TRADEMARK OFFICE
CERTIFICATE OF CORRECTION

PATENT NO. : 7,558,127 B2  Page 1 of 1
APPLICATION NO. : 12/105209
DATED : July 7, 2009
INVENTOR(S) : Nak-Won Heo et al.

It is certified that error appears in the above-identified patent and that said Letters Patent is hereby corrected as shown below:

Column 2, line 61, the words "(between 1 and 6)" should read -- (j between 1 and 6) --;
Column 10, line 26, the word "signals." should read -- signals, --;
Column 10, line 28, the word "signals." should read -- signals, --.

Signed and Sealed this

Fifteenth Day of September, 2009

David J. Kappos
*Director of the United States Patent and Trademark Office*